US010018663B2

(12) United States Patent
Seong et al.

(10) Patent No.: US 10,018,663 B2
(45) Date of Patent: Jul. 10, 2018

(54) APPARATUS AND METHOD FOR INSPECTING ELECTRICAL EQUIPMENT OF VEHICLE

(71) Applicant: Hyundai Motor Company, Seoul (KR)

(72) Inventors: Haseung Seong, Daejeon (KR); Dong Myong Kim, Suwon-si (KR)

(73) Assignee: Hyundai Motor Company, Seoul (KR)

( * ) Notice: Subject to any disclaimer, the term of this patent is extended or adjusted under 35 U.S.C. 154(b) by 270 days.

(21) Appl. No.: 14/937,537

(22) Filed: Nov. 10, 2015

(65) Prior Publication Data

US 2017/0038419 A1 Feb. 9, 2017

(30) Foreign Application Priority Data

Aug. 3, 2015 (KR) .................. 10-2015-0109698

(51) Int. Cl.
*G01R 31/00* (2006.01)
*G01V 1/00* (2006.01)
*G06K 9/00* (2006.01)
*G06K 9/20* (2006.01)

(52) U.S. Cl.
CPC ....... *G01R 31/006* (2013.01); *G06K 9/00832* (2013.01); *G06K 9/209* (2013.01); *G06K 2209/03* (2013.01); *G06K 2209/19* (2013.01); *Y10S 901/47* (2013.01)

(58) Field of Classification Search
CPC .. G01R 31/006; G06K 9/00832; G06K 9/209; G01V 1/001; Y10S 901/47
USPC .......................................................... 348/92
See application file for complete search history.

(56) References Cited

U.S. PATENT DOCUMENTS

| 5,625,197 | A | * | 4/1997 | Shimbara | ........... G01N 21/8851 |
| | | | | | 250/559.22 |
| 2002/0198618 | A1 | * | 12/2002 | Madden | ........... G05B 19/41865 |
| | | | | | 700/101 |
| 2004/0015278 | A1 | * | 1/2004 | Gordon, Jr. | ......... G01M 15/102 |
| | | | | | 701/31.4 |
| 2010/0137702 | A1 | * | 6/2010 | Park | ..................... A61B 5/0402 |
| | | | | | 600/393 |

(Continued)

FOREIGN PATENT DOCUMENTS

| JP | 2007-309761 | 11/2007 |
| JP | 2009-243918 | 10/2009 |

(Continued)

*Primary Examiner* — Andy Rao
*Assistant Examiner* — Zaihan Jiang
(74) *Attorney, Agent, or Firm* — Brinks Gilson & Lione

(57) ABSTRACT

An apparatus for inspecting electrical equipment of vehicle include: a robot unit having a plurality of joints, an actuating unit configured to move and rotate the robot unit such that the robot unit becomes close to the vehicle or moves away therefrom, an operation unit which is connected to a free end of the robot unit and configured to operate a button or a display portion in the vehicle, a photographing unit which is connected to the free end of the robot unit and positioned close to the operation unit and configured to photograph a predetermined portion in the vehicle, a sensing unit which is connected to the free end of the robot unit and configured to detect a target object, and a control portion configured to control operations of the robot unit, a moving unit, the photographing unit, and the sensing unit.

10 Claims, 10 Drawing Sheets

(56) References Cited

U.S. PATENT DOCUMENTS

| | | | | |
|---|---|---|---|---|
| 2014/0350774 A1* | 11/2014 | Mouzakitis | ........ | G01R 31/3277 701/29.1 |
| 2015/0018998 A1* | 1/2015 | Cho | ...................... | G06T 7/0004 700/109 |
| 2015/0168719 A1* | 6/2015 | Kim | ........................ | B60R 1/00 345/7 |
| 2016/0318187 A1* | 11/2016 | Tan | ........................ | B25J 9/1697 |

FOREIGN PATENT DOCUMENTS

| | | |
|---|---|---|
| JP | 2011-117870 | 6/2011 |
| JP | 2013-007629 | 1/2013 |

\* cited by examiner

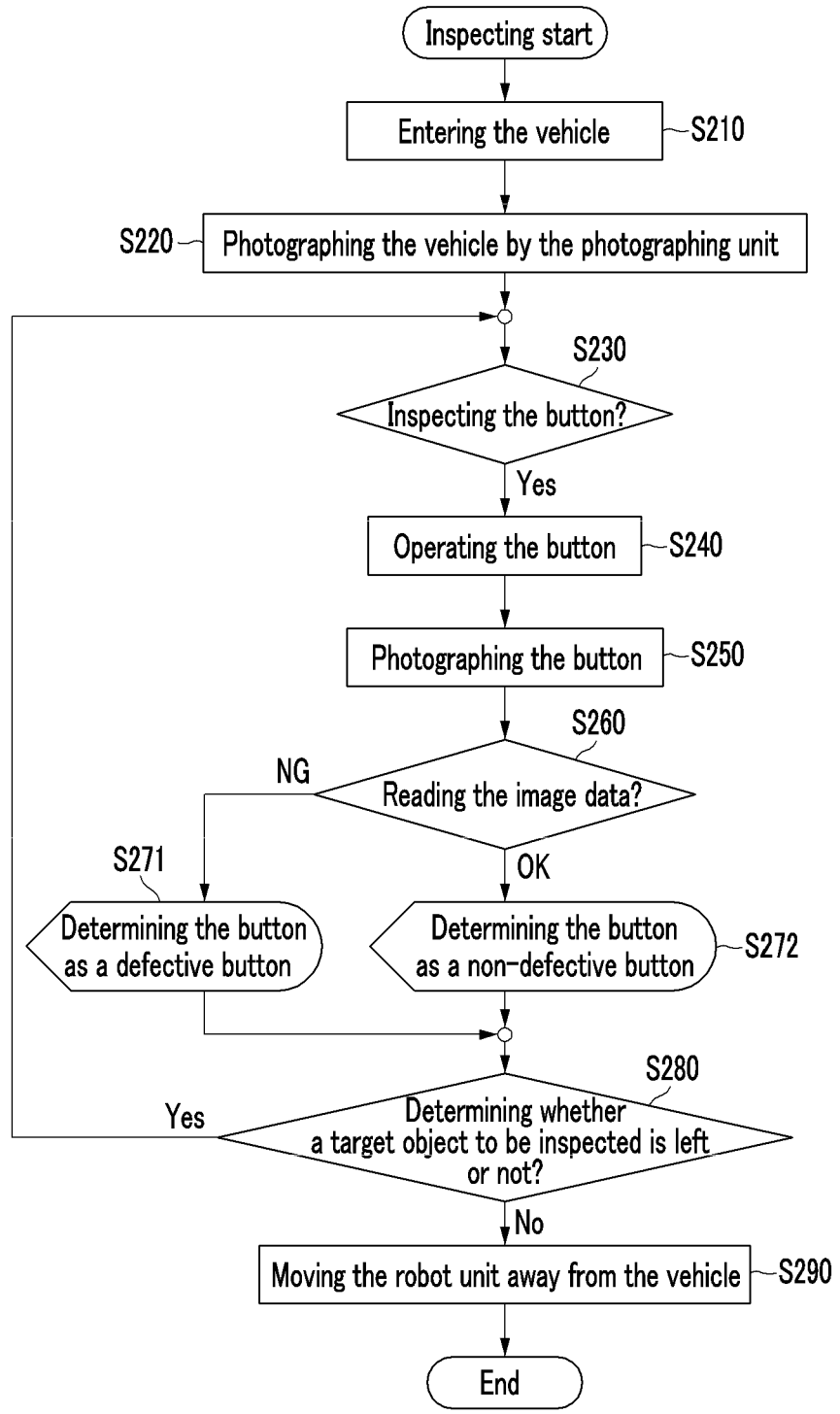

APPARATUS AND METHOD FOR INSPECTING ELECTRICAL EQUIPMENT OF VEHICLE

CROSS-REFERENCE TO RELATED APPLICATION

This application claims priority to Korean Patent Application No. 10-2015-0109698 filed on Aug. 3, 2015, the entire contents of which are incorporated herein by reference.

FIELD

The present disclosure relates to an apparatus and a method for inspecting electrical equipment. More particularly, the present disclosure relates to an apparatus and a method for inspecting operation of electrical equipment which may be used in inspection of a manufactured vehicle.

BACKGROUND

A conventional method for inspecting a button positioned in a vehicle is operating the button directly by hand and identifying with the naked eye whether an indicator light is on or not. This method has a possibility that a defective button is determined as an adequate button due to a mistake of a worker in a process of identifying with the naked eye of the worker. In addition, inspection of some buttons may be omitted in a process when the worker presses a plurality of buttons. Moreover, even if the inspection progresses satisfactorily, errors may occur in a process of filling out on an inspection paper. In other words, a button which is not a defective button may be indicated as a defective button or a button which is a defective button, may be indicated as a non-defective button.

Therefore, an accurate and prompt inspection method for electrical equipment of the vehicle has been recently demanded.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide an apparatus and a method for inspecting electrical equipment in order to inspect without decision errors of a worker.

In addition, an exemplary form of the present disclosure provides an apparatus and a method for inspecting electrical equipment which may quantify the inspection decision.

The apparatus for inspecting electrical equipment of vehicle may include: a robot unit having a plurality of joints, an actuating unit configured to move and rotate the robot unit such that the robot unit becomes close to the vehicle or moves away therefrom, an operation unit which is connected to a free end of the robot unit and configured to operate a button or a display portion in the vehicle, a photographing unit which is connected to the free end of the robot unit and positioned close to the operation unit and configured to photograph a predetermined portion in the vehicle, a sensing unit which is connected to the free end of the robot unit and configured to detect a target object, and a control portion configured to control operations of the robot unit, a moving unit, the photographing unit, and the sensing unit.

The actuating unit may include: a guide member having a predetermined length such that the robot unit is connected thereon to be slidingly moved, a first power member configured to generate power such that the robot unit moves along the guide member, and a second power member connected to a lower portion of the guide member to be rotatable and configured to generate power such that the guide member is rotated.

The operation unit may include: a first operation member which is formed in a cylindrical shape and selectively contacts a capacitive touch screen, and a second operation member positioned adjacent to the first operation member and configured to operate a switch in the vehicle.

A conductive fabric may be formed at a free end of the first operation member.

The sensing unit may be an ultrasonic wave sensor.

The apparatus for inspecting electrical equipment may further include a lighting member which is connected to the free end of the robot unit and configured to radiate light to the outside.

The photographing unit may be configured to photograph a warning lamp which is provided to a cluster and warns of an abnormality of the vehicle, and the control portion may be configured to analyze image data photographed by the photographing unit and sense an abnormality state of the vehicle.

The control portion may be configured to sense whether a function of the button is outputted at the display by the photographing unit photographing the display portion after any one of a plurality of buttons is pressed by the operation unit, and if the function of the button is not outputted at the display portion, the button is determined to be a defective button.

The control portion may be configured to sense whether a function of the button is outputted at the display by the photographing unit photographing the display portion after any one of the plurality of buttons is pressed by the operation unit, and if the function of the button is outputted at the display portion, the button is determined to be a non-defective button.

A method for inspecting electrical equipment of a vehicle of the present disclosure may include: photographing the vehicle, inspecting a button, operating the button, photographing the button, reading image data obtained by photographing the vehicle and the button, and determining whether a target object to be inspected remains.

In the reading of the obtained image data, if an indicator light formed on the button is turned on, then it may be determined that the button is non-defective, while if the indicator light formed on the button is not turned on, then it may be determined that the button is defective.

In the determining whether a target object to be inspected remains, if it is determined that the target object to be inspected remains, then the inspecting the button is implemented again, while if a target object to be inspected does not remain, then the method is ended.

The number of work processes may be reduced by the apparatus for inspecting electrical equipment according to an exemplary form of the present disclosure. Not only may a human error be prevented, but also the inspection decision is quantified and quality of the electrical equipment may be improved.

Further areas of applicability will become apparent from the description provided herein. It should be understood that the description and specific examples are intended for pur-

DRAWINGS

Figure 5:
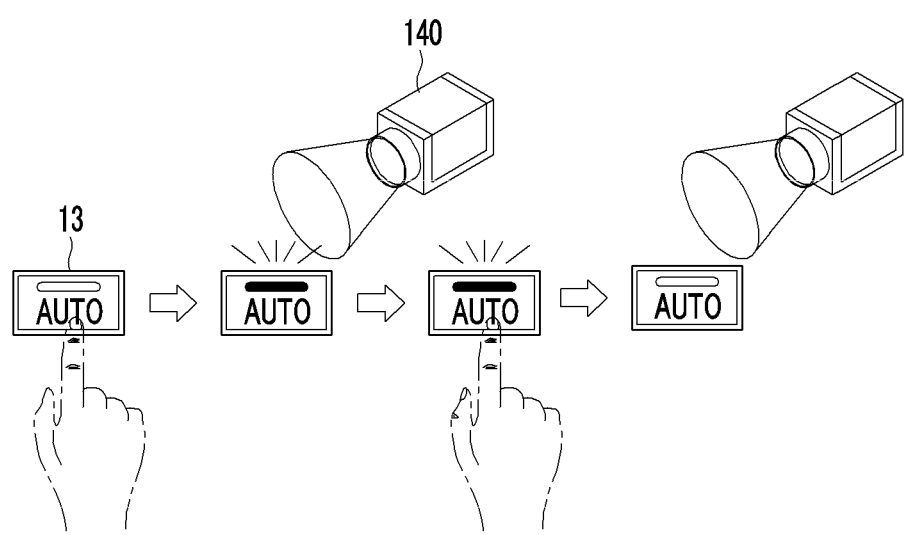

FIG. 5 sequentially illustrates a process in which the apparatus for inspecting electrical equipment presses a button and records an indicator light.

Figure 6:
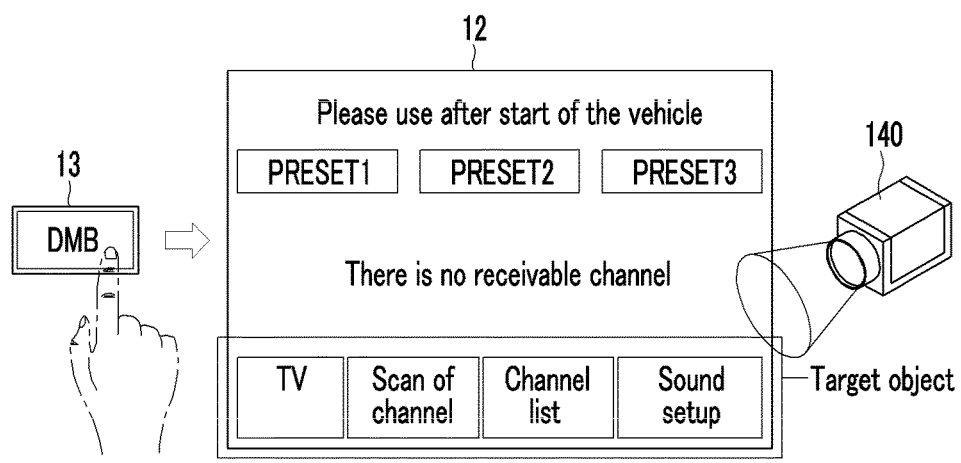

FIG. 6 sequentially illustrates a process in which the apparatus for inspecting electrical equipment presses a button and records a display portion.

Figure 7:
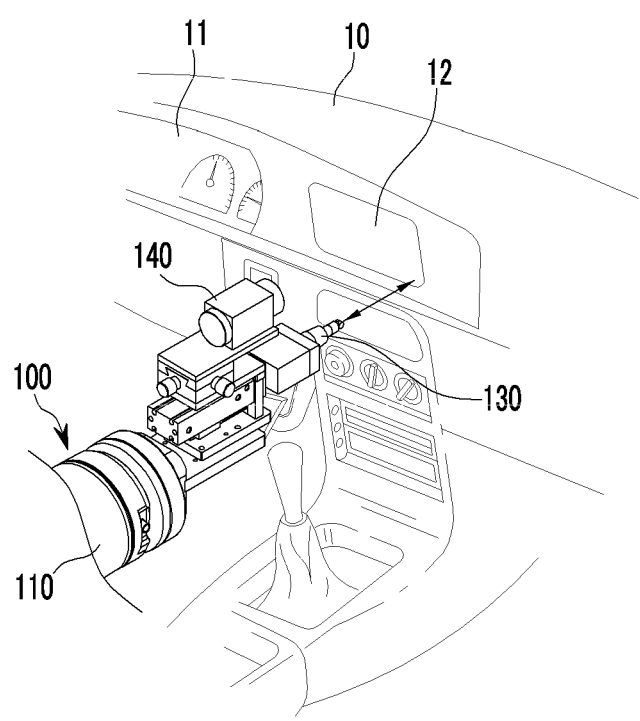

FIG. 7 illustrates a state that the apparatus for inspecting electrical equipment touches a surface of the display portion.

Figure 8:
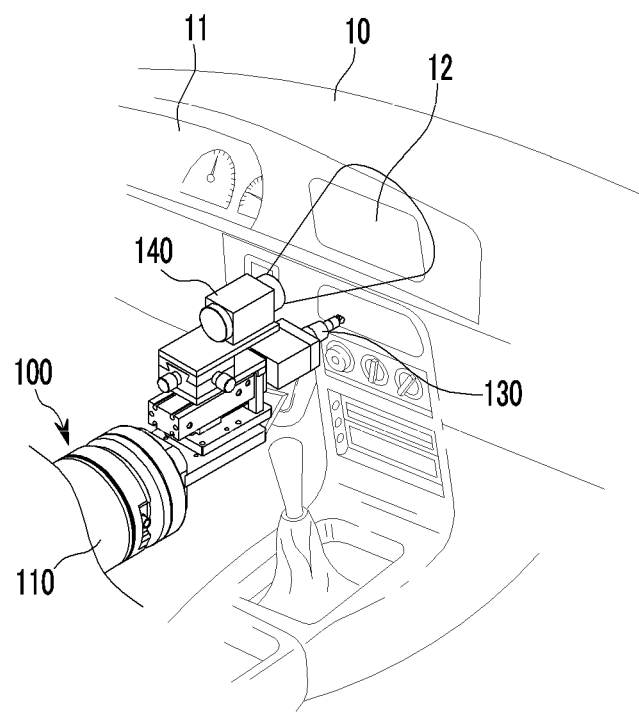

FIG. 8 illustrates a state that the apparatus for inspecting electrical equipment records the display portion.

Figure 9:
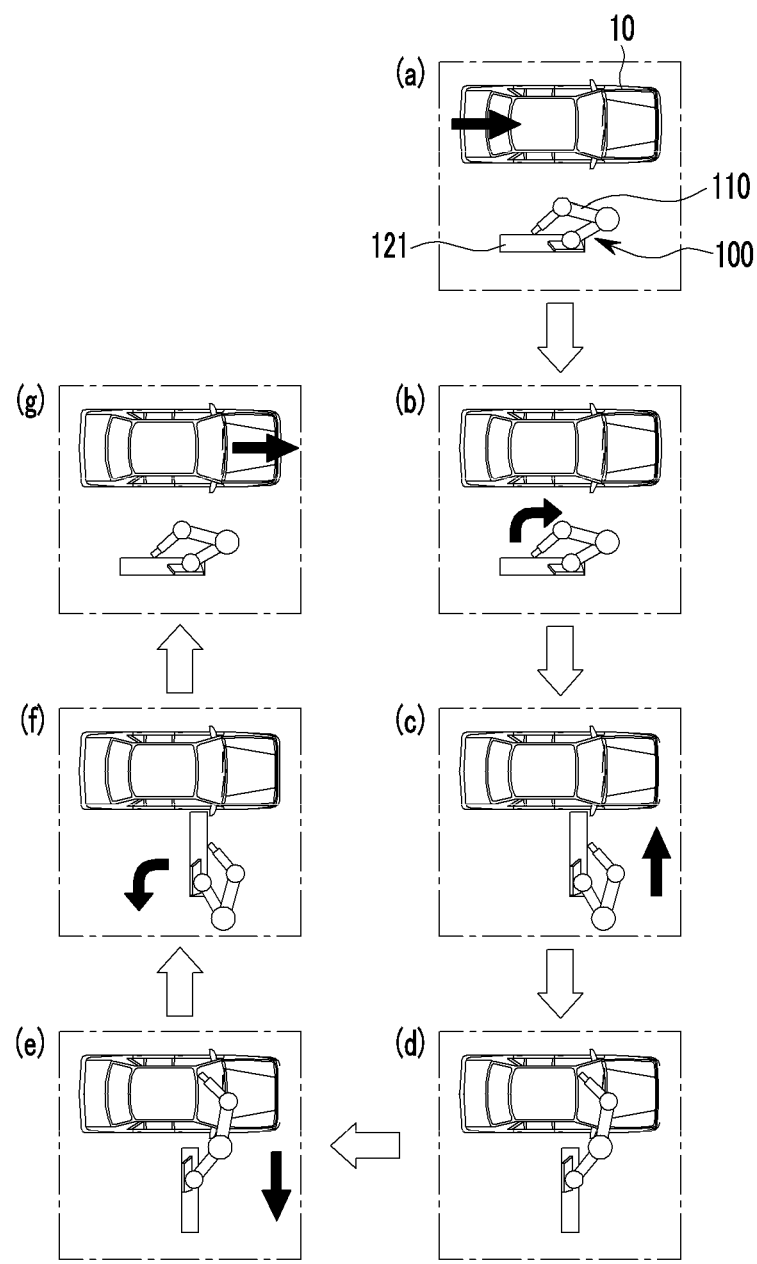

FIG. 9 sequentially illustrates a process in which the apparatus for inspecting electrical equipment operates.

FIG. 10 is a flowchart sequentially illustrating a method for inspecting electrical equipment.

The drawings described herein are for illustration purposes only and are not intended to limit the scope of the present disclosure in any way.

DETAILED DESCRIPTION

In the following detailed description, only certain exemplary forms of the present disclosure have been shown and described, simply by way of illustration. As those skilled in the art would realize, the described forms may be modified in various different ways, all without departing from the spirit or scope of the present disclosure.

The drawings and description are to be regarded as illustrative in nature and not restrictive. Like reference numerals designate like elements throughout the specification.

Further, in exemplary forms, since like reference numerals designate like elements having the same configuration, representative exemplary form is described, and in other exemplary forms, only a configuration different from the first exemplary form will be described.

Throughout this specification and the claims that follow, when it is described that an element is "coupled" to another element, the element may be "directly coupled" to the other element or "indirectly coupled" to the other element through a third element. Throughout the specification and claims which follow, unless explicitly described to the contrary, the word "comprise/include" or variations such as "comprises/includes" or "comprising/including" will be understood to imply the inclusion of stated elements but not the exclusion of any other elements.

Figure 1:
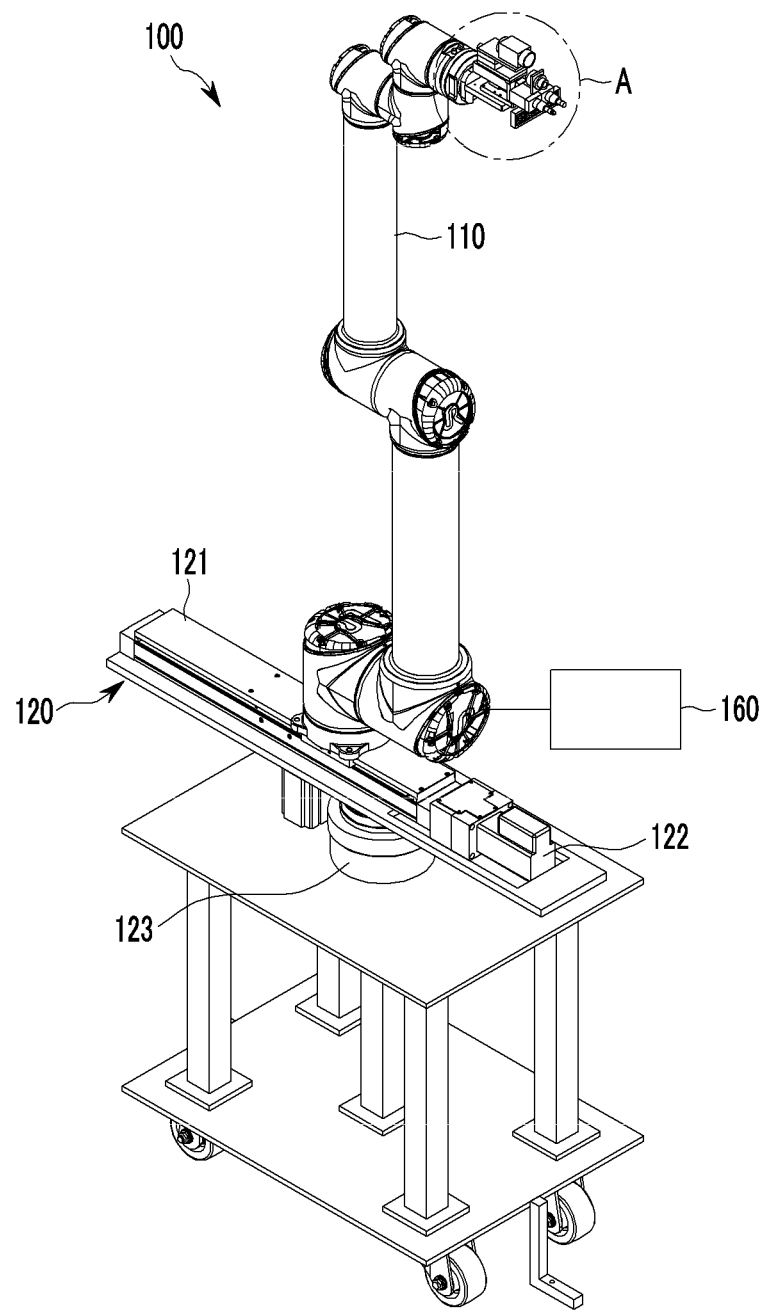
FIG. 1 is a perspective view of an apparatus for inspecting electrical equipment.
Figure 2:
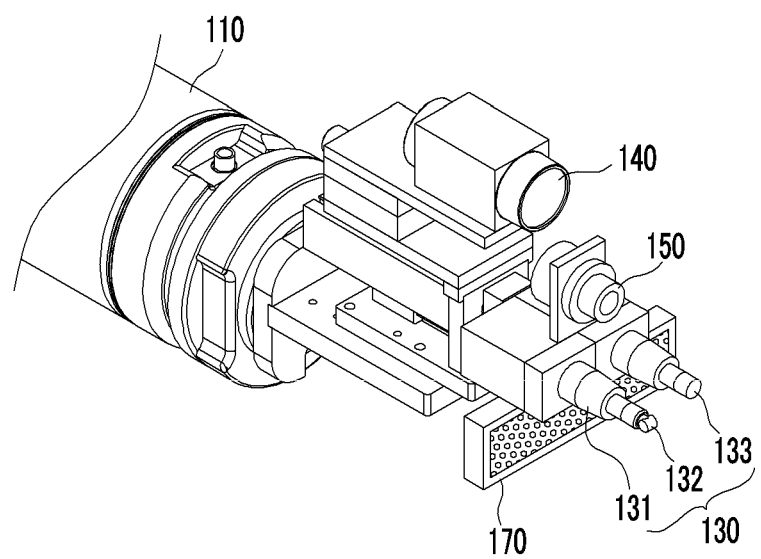
FIG. 2 is enlarged perspective view illustrating a region A of FIG. 1.
Figure 3:
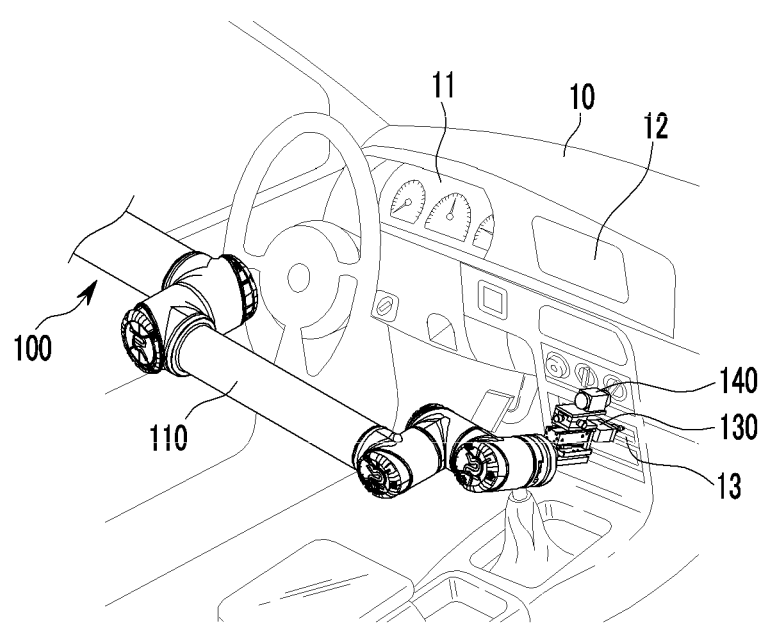
FIG. 3 illustrates a state that a part of the apparatus for inspecting electrical equipment has entered the vehicle.

FIG. 1 is a perspective view of an apparatus for inspecting electrical equipment, FIG. 2 is enlarged perspective view illustrating region A of FIG. 1, and FIG. 3 illustrates a state that a part of the apparatus for inspecting electrical equipment has entered the vehicle.

Referring to FIGS. 1 to 3, an apparatus 100 for inspecting electrical equipment of a vehicle 10 includes a robot unit 110, an actuating unit 120, an operation unit 130, a photographing unit 140, a sensing unit 150, and a control portion 160.

The robot unit 110 is provided with a plurality of joints. The plurality of joints are connected to each other such that each end thereof which is connected is to be rotatable. The robot unit 110 may enter and exit the vehicle 10 by the plurality of joints through a space in which a window is opened and closed. The number and shape of joints forming the robot unit 110 may be changed depending on a design, thus a detailed description thereof will be omitted.

The actuating unit 120 moves and rotates the robot unit 110. The actuating unit 120 positions the robot unit 110 to become close to the vehicle 10 or to move away from the vehicle 10.

This structure of the actuating unit 120, for example, includes a guide member 121, a first power member 122, and a second power member 123.

The guide member 121 has a predetermined length such that the robot unit 110 is connected thereon to be slidingly moved. For example, the guide member 121 may be formed in a square column shape.

The first power member 122 generates power such that the robot unit 110 moves along the guide member 121. For example, the first power member 122 may include a roller (not shown) and a belt (not shown), but it is not limited thereto.

The second power member 123 is connected to a lower portion of the guide member 121 to be rotatable. The second power member 123 generates power such that the guide member 121 is rotated. The second power member 123, for example, may be a rotation motor. The second power member 123 may be connected to an adjacent portion of one end of the guide member 121 formed as a square column. Therefore, the guide member 121 may be rotated around the second power member 123.

The operation unit 130 is connected to a free end of the robot unit 110. The operation unit 130 operates a button 13 or a display portion 12 in the vehicle 10.

Figure 4:
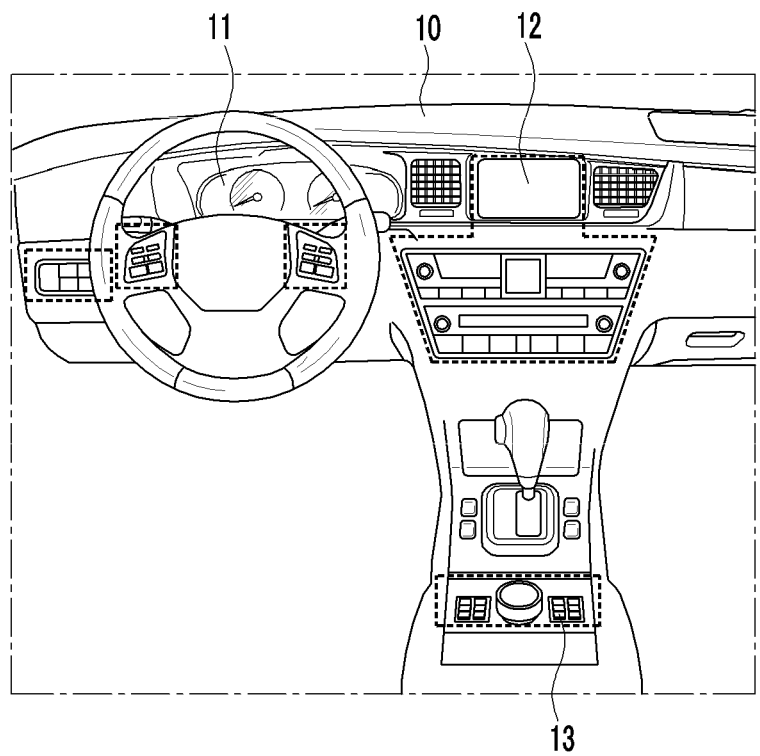
FIG. 4 illustrates buttons to be inspected by the apparatus for inspecting electrical equipment in the vehicle.

As shown in FIG. 4, the button 13 and the display portion 12 in the vehicle 10 may be an inspection object of the apparatus 100 for inspecting electrical equipment of the vehicle 10. Herein, for example, the display portion 12 may be an AVN (Audio Video Navigation) monitor. Users may enjoy music or an image or make use of navigation by the AVN monitor. In addition, a general condition of the vehicle may be outputted through the AVN monitor.

When the button 13 is operated by the operation unit 130, if the button 13 is a non-defective button, then an indicator light formed on the button 13 is turned on. Further, if the button 13 is a defective button, then the indicator light is not turned on.

The operation unit 130, for example, may include a first operation member 131 and a second operation member 133.

The first operation member 131 may be formed in a cylindrical shape. The first operation member 131 may selectively contact a capacitive touch screen. Accordingly, the first operation member 131 may be moved in a length direction thereof.

A conductive fabric 132 may be formed at a free end of the first operation member 131. The conductive fabric 132 has conductivity. This conductive fabric 132 may smoothly cause a current change on a surface of the capacitive touch screen when the first operation member 131 contacts the capacitive touch screen, and prevents scratches from being generated at the capacitive touch screen.

The second operation member 133 positioned adjacent to the first operation member 131 and operates the button 13 in the vehicle 10. The second operation member 133 may be formed in a column shape like the first operation member 131. The second operation member 133 may be moved in a length direction thereof like the first operation member 131.

The photographing unit 140 is connected to the free end of the robot unit 110, is positioned adjacent to the operation unit 130, and photographs a predetermined portion in the vehicle 10. The photographing unit 140 photographs the indicator light of the button 13 which is manipulated by the operation unit 130. In addition, the photographing unit 140 photographs the display portion 12 which is touched by the operation unit 130.

To this end, the photographing unit 140, for example, may include a camera and a storage portion. Image data which is recorded by the camera may be saved at the storage portion.

The photographing unit 140 may record not only the button 13 and the display portion 12, but also a warning lamp which is formed at an instrument panel 11 of the vehicle 10. The warning lamp instructs abnormality of the vehicle 10. If the photographing unit 140 records the instrument panel 11, the control portion 160 analyzes the image data recorded by the photographing unit 140 and senses an abnormality state of the vehicle.

The sensing unit 150 is connected to the free end of the robot unit 110 and senses a target object. The sensing unit 150 may be an ultrasonic wave sensor. The target object may be a window of the vehicle 10. In other words, the sensing unit 150 may sense whether the window of vehicle 10 is opened or not.

In further detail, the sensing unit 150 may sense whether the window positioned at sides of the vehicle 10 is opened or not. The sensing unit 150 is provided for preventing the operation unit 130 or the photographing unit 140 from colliding with the window.

The control portion 160 controls operation of the robot unit 110, the actuating unit 120, the photographing unit 140, and the sensing unit 150.

The operation of the robot unit 110, the actuating unit 120, the photographing unit 140, and the sensing unit 150 will be described below.

Meanwhile, the apparatus for inspecting electrical equipment of vehicle 100 according to an exemplary form of the present disclosure further includes a lighting member 170.

The lighting member 170 is connected to the free end of the robot unit 110 and radiates light to the outside. The lighting member 170, for example, may be an LED (Light-Emitting Diode). The LED has a relatively long life compared with other sorts of lights. Further, LED has lower power consumption and higher illumination compared with other sorts of lights.

Since the lighting member 170 is the LED, the apparatus 100 for inspecting electrical equipment of a vehicle 10 may have a long life and maintenance costs may be decreased. In addition, since the inside of the vehicle 10 is lit by the lighting member 170, sufficient illumination may be provided in order to photograph the button 13 or the display portion 120.

Thus, the photographing unit 140 may clearly record the button 13 or the display portion 12. Therefore, when the control portion 160 determines that the image data is obtained, the reliability may be improved.

Meanwhile, the above photographing unit 140 photographs the vehicle 10 being moved into an inspection space. If each of vehicles 10 is moved into the inspection space and stopped, it may be difficult for each vehicle to stop at the same location. That is, an error may occur because stopping locations of the vehicles 10 are different.

After the photographing unit 140 photographs the vehicle 10, the control portion 160 calculates an error value having occurred based on a predetermined reference position of the vehicle 10. The control portion 160 controls the robot unit 110, the operation unit 130 of which may correctly operate the button 13 according to the error value.

FIG. 5 sequentially illustrates a process in which the apparatus for inspecting electrical equipment presses a button and records an indicator light.

Referring to FIG. 5, the control portion 160 controls the photographing unit 140 to photograph the indicator light of the button 13 after any one of the plurality of buttons is pressed by the operation unit 130. The control portion analyses the image data stored in the storage portion of the photographing unit 140, and determines whether the indicator light of the button 13 is turned on.

If it is determined that the button 13 is turned on, then the control portion 160 determines the button 13 to be non-defective. And, if it is determined that the button 13 is not turned on, then the control portion 160 determines the button 13 to be defective.

FIG. 6 sequentially illustrates a process in which the apparatus for inspecting electrical equipment presses a button and records a display portion.

Referring to FIG. 6, the button 13 may not have the indicator light depending on the vehicle, and an operation state of the button 13 may be outputted to the display portion 12.

In this case, the control portion 160 controls the photographing unit 140 to photograph the display portion 12 after any one of the plurality of buttons 13 is pressed by the operation unit 130, and senses whether a function of the button 13 is outputted at the display portion 12.

Further, if the function of the button 13 is not outputted at the display portion 12, the button 13 is determined to be a defective button. On the other hand, the function of the button 13 is outputted at the display portion 12, the button 13 is determined to be a non-defective button.

FIG. 7 illustrates a state that the apparatus for inspecting electrical equipment touches a surface of the display portion, and FIG. 8 illustrates a state that the apparatus for inspecting electrical equipment records the display portion.

Referring to FIGS. 7 to 8, as described above, the operation unit 130 may manipulates the display portion 12, and the display portion 12 may be a capacitive touch screen or a pressurized touch screen. If the display portion 12 is the capacitive touch screen, the first operation member 131 operates the display portion 12. Further, if the display portion 12 is the pressurized touch screen, the second operation member 133 operates the display portion 12.

As shown in FIG. 7, the operation unit 130 operates a command button (not shown) which is outputted at the display portion 12. After that, as shown in FIG. 8, the photographing unit 140 photographs the display portion 12. The control portion 160 analyses the image data obtained by the photographing unit 140 and determines whether a function of the command button is done. Accordingly, the control portion 160 determines whether the display portion 12 is non-defective.

Meanwhile, a process in which the apparatus for inspecting electrical equipment of vehicle 100 is operated by the actuating unit 120 for inspecting the inside of the vehicle 10 will be described below.

FIG. 9 sequentially illustrates a process in which the apparatus for inspecting electrical equipment operates.

Referring to parts (a) and (b) of FIG. 9, the vehicle 10 is moved to the inspection space and stopped beside the apparatus 100 for inspecting electrical equipment of the vehicle 10. At that time, the guide member 121 may be disposed in a moving direction of the vehicle 10. Next, as shown in a part (c), the guide member 121 is rotated by 90° clockwise to be perpendicular to the moving direction of the vehicle 10. Subsequently, as shown in a part (d), the robot unit 110 is moved in a direction which is close to the vehicle 10 along the guide member 121, and the button 13 and display portion 12 are inspected by the operation unit 130 and photographing unit 140.

Further, as shown in parts (e) and (f), the robot unit 110 is moved in a direction away from the vehicle 10 along the guide member 121. Finally, as shown in a part (g), the guide member 121 may be rotated counterclockwise by 90° to be parallel with the moving direction of the vehicle 10 again. The vehicle 10 of which the inspection is complete may then be moved to another space.

As described above, the position of the apparatus 100 for inspecting electrical equipment of the vehicle 10 may be variously changed. Therefore, interference between the vehicle 10 and the robot unit 110 when the vehicle 10 is moved is prevented.

Hereinafter, an operation process of the apparatus for inspecting electrical equipment of the vehicle according to an exemplary form of the present disclosure will be described with reference to the drawings.

FIG. 10 is a flowchart sequentially illustrating a method for inspecting electrical equipment.

Referring to FIG. 10, a method for inspecting electrical equipment according the exemplary form of the present disclosure includes photographing the vehicle 10 (S220), inspecting the button 13 (S230), operating the button 13 (S240), photographing the button 13 (S250), reading image data obtained by photographing the vehicle 10 and the button 13 (S260), and determining whether a target object to be inspected remains (S280).

First, when the inspecting electrical equipment of the vehicle 10 starts, the vehicle 10 is moved near the apparatus 100 for inspecting electrical equipment of the vehicle 10.

Next, in the photographing the vehicle 10 (S220), the photographing unit 140 photographs the vehicle and the control portion 160 compensates the position of the vehicle 10.

In the inspecting the button 13 (S230), the operation unit 130 manipulates the button 13 (S240) and photographs the button 13 with the photographing unit 140 (S250).

Next, in the reading an image data obtained (S260), the control portion 160 reads the image data which is photographed. If an indicator light formed on the button is turned on in the obtained image data, the control portion 160 determines that the button is non-defective (S272). Further, if the indicator light formed on the button is turned off in the image data obtained, the control portion 160 determines that the button is defective (S271). If a defective button is found, then positions of the buttons may be outputted on a separate screen. Otherwise, the positions of the defective buttons may be printed out.

Finally, in the determining whether a target object to be inspected remains (S280), if it is determined that the target object to be inspected remains, then the process returns to process S230 again to repeatedly perform the aforementioned process. Otherwise, if a target object to be inspected does not remain, then the robot unit 110 is moved away from the vehicle 10 and the method is ended.

The number of work processes may be reduced by the method for inspecting electrical equipment of a vehicle according to an exemplary form of the present disclosure vehicle In addition, it prevents human error and the inspection decision is quantified, thus quality of electrical equipment may be improved.

Hereinabove, exemplary forms of the present disclosure are described, but the accompanying drawings and the detailed description of the present disclosure described above are just used for the purpose of describing the present disclosure and are not used for qualifying the meaning or limiting the scope of the present disclosure, which is disclosed in the appended claims. Therefore, it will be appreciated to those skilled in the art that various modifications are made and other equivalent forms are available. Accordingly, the actual technical protection scope of the present disclosure must be determined by the spirit of the appended claims.

What is claimed is:

1. An apparatus for inspecting electrical equipment of a vehicle, comprising:
   a robot unit having a plurality of joints;
   an actuator configured to move and rotate the robot unit to move closer to or further away from the vehicle, wherein the actuator comprises:
      a guide member with a predetermined length, wherein the robot unit is connected to the guide member to slide along the predetermined length of the guide member;
      a first power member configured to generate power for moving the robot unit along the guide member; and
      a second power member configured to generate power for rotating the guide member, the second power member being connected to a lower portion of the guide member to be rotatable;
   an operation controller configured to operate a button or a display portion in the vehicle, the operation controller being connected to a free end of the robot unit;
   an image capturing device configured to capture an image of a predetermined portion in the vehicle, the image capturing device being connected to the free end of the robot unit and positioned close to the controller;
   a sensor configured to detect a target object, the sensor being connected to the free end of the robot unit; and
   a controller configured to control operations of the robot unit, a moving unit, the image capturing device, and the sensor.

2. The apparatus for inspecting electrical equipment of claim 1, wherein the operation controller comprises:
   a first operation member configured to selectively contacts a capacitive touch screen, the first operation member which being formed in a cylindrical shape; and
   a second operation member configured to operate a switch in the vehicle, the second operation member being positioned adjacent to the first operation member.

3. The apparatus for inspecting electrical equipment of claim 2, wherein a conductive fabric is formed at a free end of the first operation member.

4. The apparatus for inspecting electrical equipment of claim 1, wherein the sensor is an ultrasonic wave sensor.

5. The apparatus for inspecting electrical equipment of claim 1, further comprising a lighting member configured to radiate light outwards, the lighting member being connected to the free end of the robot unit.

6. The apparatus for inspecting electrical equipment of claim 1, wherein the image capturing device is configured to capture an image of a warning lamp which is provided to a cluster and warns of an abnormality of the vehicle, and the controller is configured to analyze image data captured by the photographing unit and sense an abnormality state of the vehicle.

7. The apparatus for inspecting electrical equipment of claim 1, wherein the controller is configured to sense whether a function of the button is outputted at the display portion by the image capturing device capturing an image of the display portion after any one of a plurality of buttons is pressed by the operation controller, and if the function of the button is not outputted at the display portion, the button is determined to be a defective button.

8. The apparatus for inspecting electrical equipment of claim 1, wherein the controller is configured to sense whether a function of the button is outputted at the display portion by the image capturing device capturing an image of the display portion after any one of a plurality of buttons is pressed by the operation controller, and if the function of the button is outputted at the display portion, the button is determined to be a non-defective button.

9. A method for inspecting electrical equipment of a vehicle using the apparatus of claim 1, the method comprising:
    photographing the vehicle;
    inspecting the button;
    operating the button; photographing the button;
    reading image data obtained by photographing the vehicle and the button; and
    determining whether a target object to be inspected remains;
    wherein the reading image data comprises, if an indicator light formed on the button is turned on, determining that the button is non-defective, and
    if the indicator light formed on the button is not turned on, determining that the button is defective.

10. The method for inspecting electrical equipment of a vehicle of claim 9, wherein the determining whether a target object to be inspected remains comprise if it is determined that a target object to be inspected remains, implementing the inspecting of the button again, and if a target object to be inspected does not remain, terminating the method.

\* \* \* \* \*